United States Patent
Fan et al.

(10) Patent No.: US 7,301,768 B2
(45) Date of Patent: Nov. 27, 2007

(54) MOUNTING APPARATUS FOR A FAN

(75) Inventors: Chen-Lu Fan, Tu-Cheng (TW); Li-Ping Chen, Tu-Cheng (TW)

(73) Assignee: Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 200 days.

(21) Appl. No.: 11/292,255

(22) Filed: Dec. 1, 2005

(65) Prior Publication Data
US 2006/0285292 A1    Dec. 21, 2006

(30) Foreign Application Priority Data
Jun. 18, 2005    (CN) .................. 2005 2 0060286 U

(51) Int. Cl.
*H05K 7/20* (2006.01)
*A45C 13/22* (2006.01)
*A47B 81/00* (2006.01)

(52) U.S. Cl. ................ 361/695; 415/213.1; 312/223.2; 16/422

(58) Field of Classification Search ..................... None
See application file for complete search history.

(56) References Cited

U.S. PATENT DOCUMENTS

| | | | |
|---|---|---|---|
| 6,213,819 B1* | 4/2001 | Fan ............................. | 439/894 |
| 6,373,698 B1* | 4/2002 | Christensen ................ | 361/695 |
| 6,708,372 B2* | 3/2004 | Stewart ....................... | 16/422 |
| 6,826,048 B1 | 11/2004 | Dean et al. | |
| 7,230,826 B2* | 6/2007 | Kyle et al. .................. | 361/695 |

* cited by examiner

*Primary Examiner*—Boris Chervinsky
(74) *Attorney, Agent, or Firm*—Morris Manning Martin LLP; Tim Tingkang Xia, Esq.

(57) ABSTRACT

A mounting apparatus for a fan includes a cabinet (30) for receiving a fan (10), a bracket (50) for receiving the cabinet (30) and a lever (60) pivotally mounted on the bracket (50). The cabinet (30) includes a securing tab (36) protruding from therein. The lever (60) includes a blocking portion (63) corresponding to the securing tab (36) of the cabinet (30). Wherein when the lever (60) rotates back, the blocking portion (63) of the lever (60) abuts against the securing tab (36) of the cabinet (30) to secure the cabinet (30) into the bracket (50).

18 Claims, 4 Drawing Sheets

MOUNTING APPARATUS FOR A FAN

BACKGROUND OF THE INVENTION

1. Field of the Invention

The present invention relates to a mounting apparatus, and more particularly to a fan mounting apparatus used in a computer or a sever.

2. Background of the Invention

Electronic devices typically generate heat during operating due to the flow of electricity through electronic components housed within the device. Electronic components may be damaged if this heat is not removed. Generally, An electronic device uses a fan to produce a flow of air for cooling the electronic components. Conventionally, a fan is mounted in the electronic device by a plurality of screws passing through corresponding holes of the fan, making it difficult and time consuming to replace or remove the fan for repair. Especially, in other electronic systems, such as severs, a mass of heat is produced from much more electronic components. So, redundant fans may be provided to increase speed for cooling the components. Much more screws are needed to mount the fans to the electronic device, making the replacement and removal process more difficult.

Accordingly, what is needed is a mounting apparatus for fans easily to be attached and removed from the electronic device enclosure.

SUMMARY OF THE INVENTION

A mounting apparatus for a fan includes a cabinet for receiving a fan, a bracket for receiving the cabinet and a lever pivotally mounted on the bracket. The cabinet includes a securing tab protruding from therein. The lever includes a blocking portion corresponding to the securing tab of the cabinet. Wherein when the lever rotates back, the blocking portion of the lever abut against the securing tab of the cabinet to secure the cabinet into the bracket.

Other advantages and novel features of the present invention will be drawn from the following detailed description of preferred embodiment with attached drawings, in which:

DETAIL DESCRIPTION OF THE INVENTION

Figure 1:
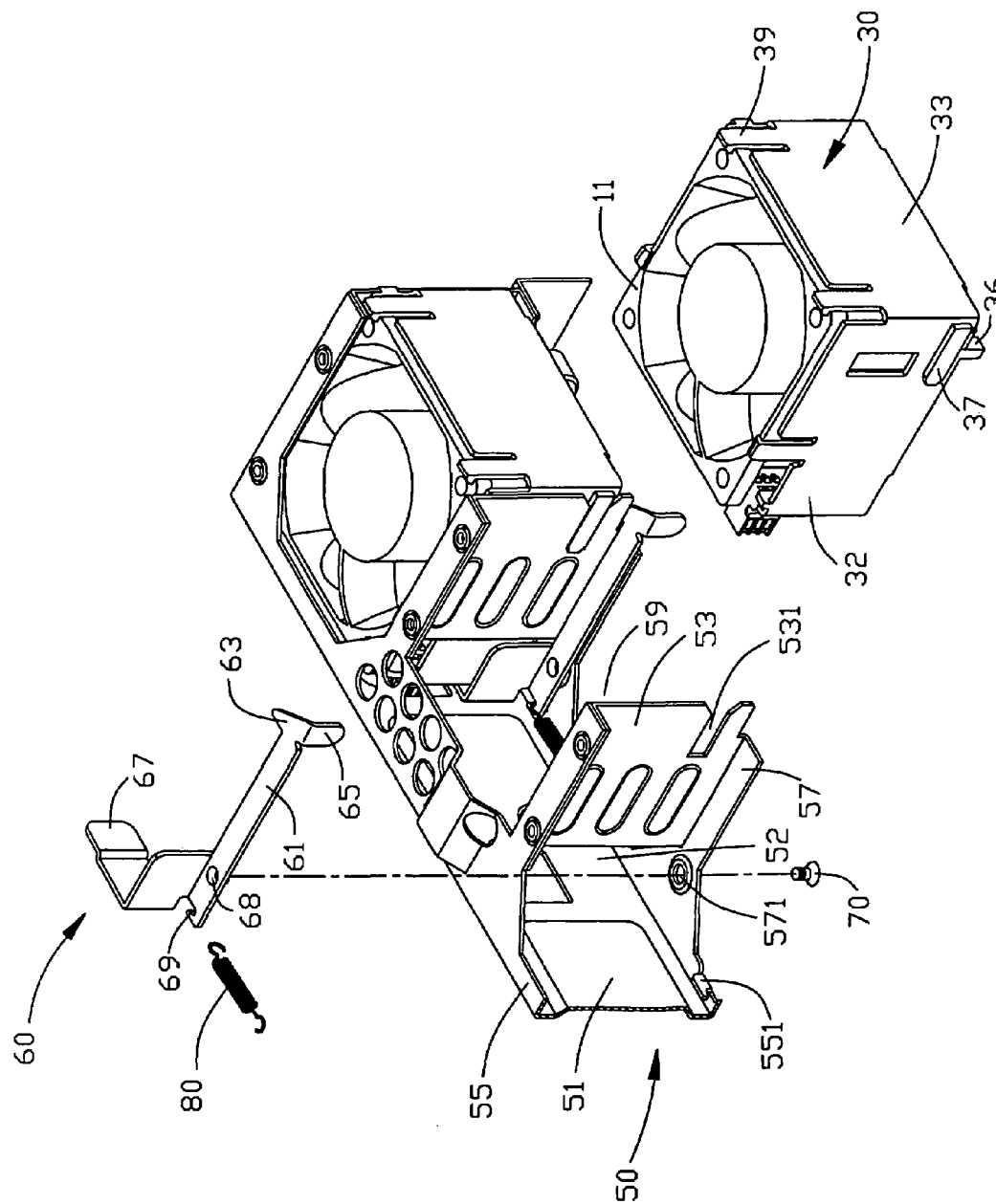
FIG. 1 is an exploded isometric view of the preferred embodiment of a mounting apparatus for a fan.
Figure 2:
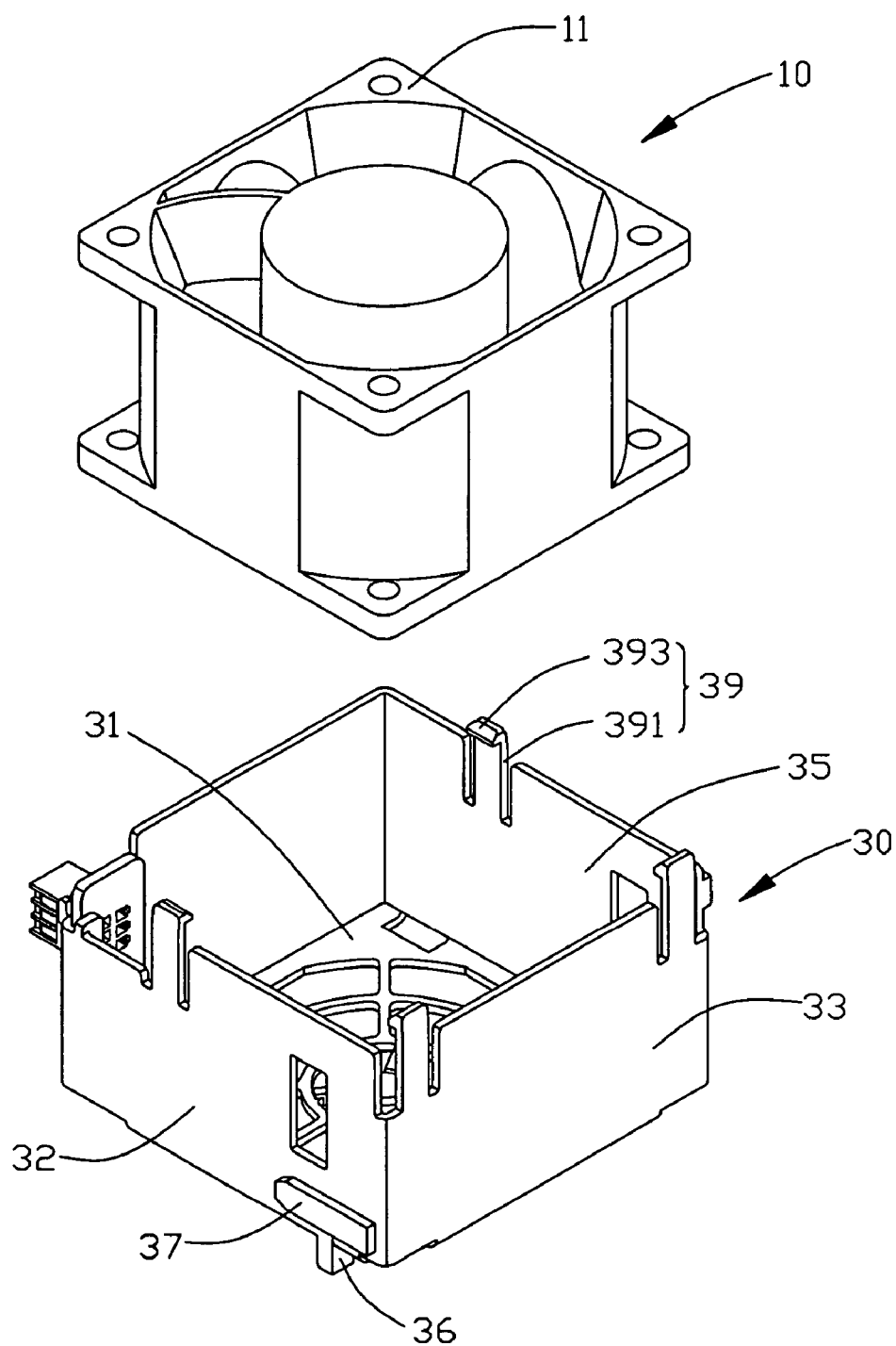
FIG. 2 is an exploded view of the fan and the receiving bracket in FIG. 1.

Referring to FIGS. 1 and 2, an apparatus for mounting a functional component like a fan 10 in a computer or other electronic devices includes a bracket 50 and a receiving cabinet 30 for accommodating the fan 10 to form a functional component module. In the present embodiment, the mounting apparatus is used for mounting a plurality of fans 10 in a chassis of the computer.

The receiving cabinet 30 includes a bottom wall 31, a pair of opposite side walls 32 perpendicular to the bottom wall 31 and another pair of side walls 33 adjacent to the side walls 32. A receiving housing 35 for capturing a fan 10 is formed by the bottom wall 31 and the side walls 32, 33. A securing tab 36 protrudes downwards from the bottom wall 31. A guiding protrusion 37 protrudes from one of the side walls 32. A plurality of elastic hooks 39 is formed at the top edge of the side walls 32 and 33. Each of the elastic hooks 39 includes a cantilever 391 and a catch portion 393. A gap is defined between the cantilever 391 and the side wall 32 or 33 for providing elasticity to the cantilever 391.

The bracket 50 includes a bottom wall 51 and a plurality of spaced side walls 53 perpendicular to the bottom wall 51. A pair of flanges 55 and a pair of flanges 57 respectively extend from the bottom wall 51 and the side walls 53. A plurality of receiving housings 59 for capturing the cabinets 30 is formed by the bottom wall 51, side walls 53 and the flanges 55 and 57. An opening 52 is defined in the side wall 53. A slot 531 for the guiding protrusion 37 sliding therein is defined in each of the side walls 53. A claw 551 for one end of a spring 80 engaging thereto extends from one of the flanges 55 of the bottom wall 51. A securing hole 571 is defined in a corner of the receiving housing 59 adjacent to the opening 52.

The bracket 50 further includes an L-shaped lever 60 used as a controller pivotally mounted on the flange 57 of the side wall 53. The controller, i.e., the lever 60 includes an operating arm 61 for operation and an pushing arm 67 perpendicular to the operating arm 61. The pushing arm 67 extends into an adjacent receiving housing 59 through the opening 52. That is, the operating arm 61 is mounted in one receiving housing 59, and the pushing arm 67 is in an adjacent receiving housing 59. A pivotal hole 68 corresponding to the securing hole 571 is defined in the operating arm 61. The lever 60 is pivotally mounted on the bracket 50 by a pivotable fastener 70 passing through the pivotal hole 68 and the securing hole 571. The operating arm 61 further includes a blocking portion 63 corresponding to the securing tab 36. A claw 69 is formed on the operating arm 61 for the other end of the spring 80 engaging thereto.

Figure 3:
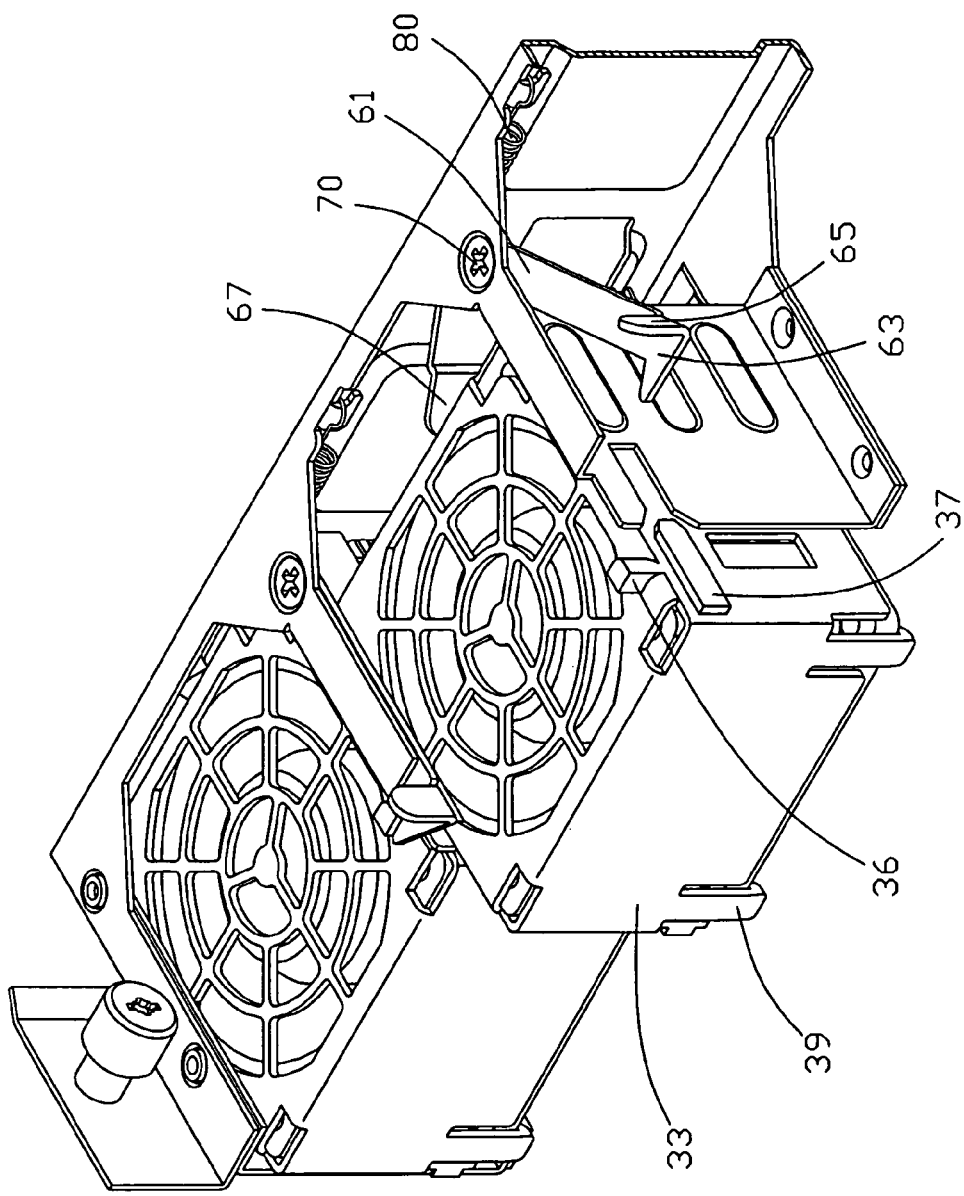
FIG. 3 is an pre-assembled view of the mounting apparatus of FIG. 1, but viewed from another aspect.
Figure 4:
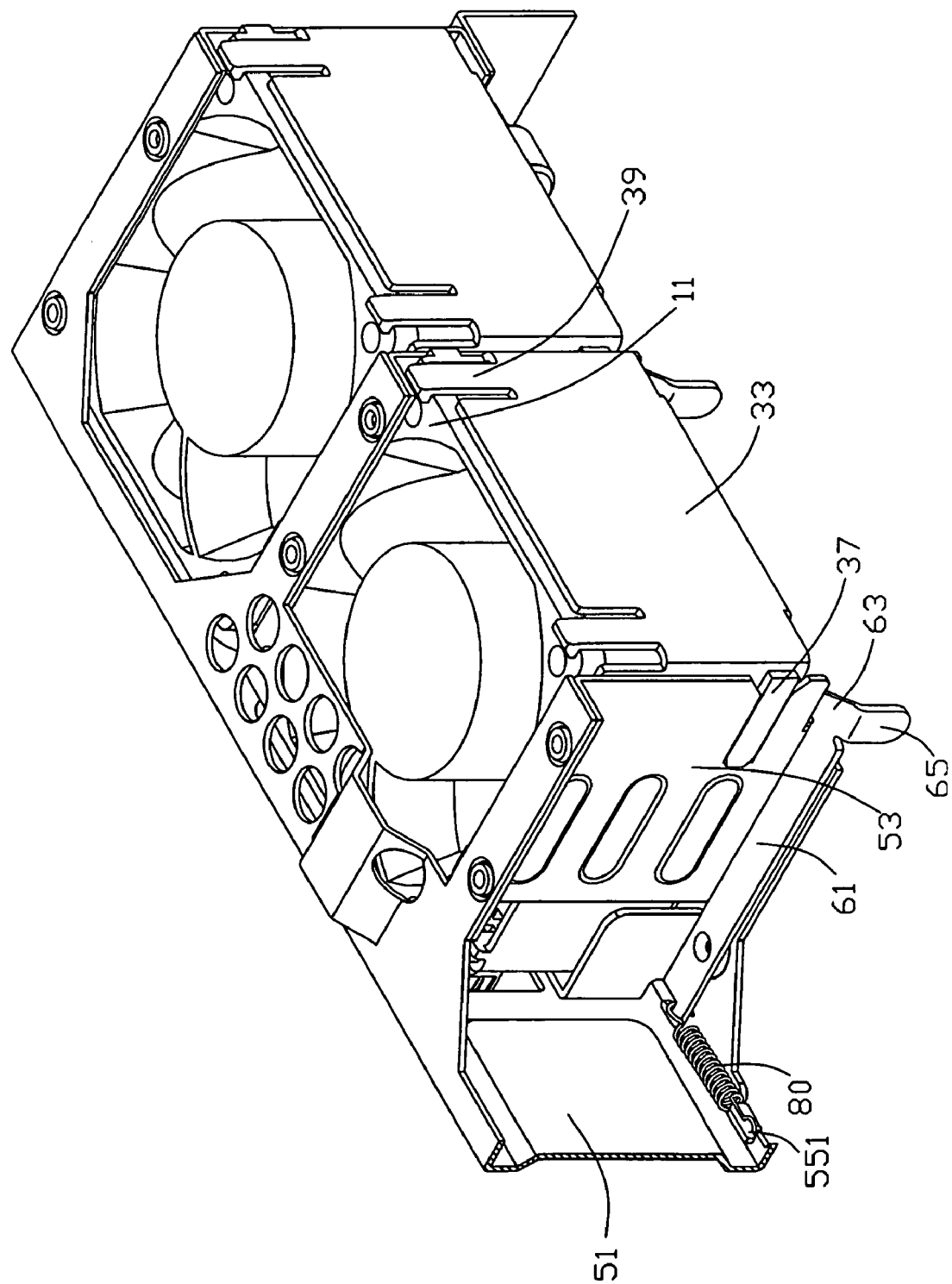
FIG. 4 is an assembled view of the mounting apparatus of FIG. 1.

In assembly, the fan 10 is pushed into the cabinet 30 to form a fan module. The hooks 39 are forced to deform outwardly by a side edge of the fan 10. When the fan 10 is completely received in the receiving housing 35 of the cabinet 30, the hooks 39 rebound back to an initial state. A top 11 of the fan 10 is engaged by the catch portions 393 of the hooks 39 and the fan 10 is secured into the cabinet 30. Then, the fan module of the fan 10 and the cabinet 30 is inserted into the receiving housing 59 and the guiding block 37 of the cabinet 30 slides in the slot 531 of the side wall 53. Referring to FIG. 3, when the fan module enters into the receiving housing 59, the pushing arm 67 is pushed to drive the lever 60 to be rotated. The blocking portion 63 of the operating arm 61 is pivoted to abut against the securing tab 36 of the cabinet 30. Thereby, the fan module can not be withdrawn from the bracket 50 due to the blocking portion 63 and the securing tab 36. After a plurality of fan modules are secured into the bracket 50, the bracket 50 is mounted in a computer or sever enclosure (not shown), then the fans 10 are all secured into the enclosure (referring to FIG. 4).

Referring also to FIG. 3, to remove the fan from the bracket 50 for repair or replacement, the pressing tab 65 of the operating arm 61 is deflected outwardly to cause the lever 60 to be rotated about the pivotable fastener 70. The blocking portion 63 of the operating arm 61 disengages from the securing tab 36. The pushing arm 67 is pivoted, thereby pushing the cabinet 30 out of the bracket 50. Then the fan is removed from the bracket 50. Due to the spring 80, the lever 60 comes back to an initial state for next operation.

It is to be understood, however, that even though numerous characteristics and advantages have been set forth in the foregoing description of preferred embodiments, together with details of the structure and function, the disclosure is illustrative only, and changes may be made in detail, especially in matters of shape, size, and arrangement of parts within the principles of the invention to the full extent indicated by the broad general meaning of the terms in which the appended claims are expressed.

We claim:

1. A fan module assembly comprising:
 a fan module having a securing tab protruding therefrom;
 a bracket for receiving the fan module; and
 a lever pivotally mounted on the bracket, the lever comprising a blocking portion corresponding to the securing tab; wherein the blocking portion of the lever abuts against the securing tab of the fan module to secure the fan module into the bracket.

2. The fan module assembly as described in claim 1, further comprising a spring for elastically connecting the lever to the bracket.

3. The fan module assembly as described in claim 2, wherein the lever is L-shaped.

4. The fan module assembly as described in claim 2, wherein the lever comprises an operating arm and a pushing arm perpendicular thereto.

5. The fan module assembly as described in claim 4, wherein the bracket has a plurality of receiving housings for capturing at least one cabinet, the operating arm is mounted in one of the receiving housings, and the pushing arm extends into an adjacent receiving housing.

6. The fan module assembly as described in claim 4, wherein the operating arm and the bracket respectively form a claw for the spring engaging thereto.

7. The fan module assembly as described in claim 4, wherein the blocking portion is formed on the operating arm, and the operating arm further comprises a pressing tab perpendicular to the blocking portion.

8. The fan module assembly as described in claim 1, wherein a guiding block protrudes from a side wall of the fan module.

9. The fan module assembly as described in claim 8, wherein the bracket comprises a bottom wall and a plurality of spaced side walls perpendicular to the bottom wall, and each of the side walls defines a slot for the guiding block sliding therein.

10. A mounting apparatus for a fan comprising:
 a cabinet for receiving a fan;
 a bracket for capturing the cabinet, the bracket comprising a bottom wall and a plurality of spaced side walls perpendicular to the bottom wall, an opening is defined in the side wall; and
 a lever pivotally mounted on the bracket, the lever comprising a pushing arm extending through the opening and abutting against the cabinet, wherein when the lever is rotated, the pushing arm pushes the cabinet out of the bracket.

11. The mounting apparatus for a fan as described in claim 10, wherein a securing tab protrudes from a bottom wall of the cabinet, and the lever comprises an operating arm having a blocking portion for coupling with the securing tab.

12. The mounting apparatus for a fan as described in claim 11, wherein the operating arm together with the pushing arm form an L-shaped lever, and the operating arm of the lever further comprises a pressing portion perpendicular to the blocking portion.

13. The mounting apparatus for a fan as described in claim 11, wherein the bracket has a plurality of receiving housings for capturing at least one cabinet, the operating arm is mounted in one of the receiving housings, and the pushing arm extends into an adjacent receiving housing.

14. The mounting apparatus for a fan as described in claim 10, wherein the lever and the bracket respectively form a claw for a spring engaging thereto.

15. The mounting apparatus for a fan as described in claim 10, wherein a guiding block protrudes from a side wall of the cabinet.

16. The mounting apparatus for a fan as described in claim 15, wherein each of the side walls of the bracket defines a slot for the guiding block sliding therein.

17. An electronic device comprising:
 a functional component module of said electronic device;
 a bracket for accommodating more than one module including said functional component module installable in said electronic device, said functional component module movable into said bracket along a first direction;
 a controller movably attachable to one of said functional component module and said bracket, said controller capable of moving along a second direction different from said first direction to secure said functional component module in said bracket when said functional component module completely moves into said bracket, and moving along an opposite direction to said second direction to expel said functional component module out of said bracket along said first direction.

18. The electronic device as described in claim 17, wherein said controller is a lever pivotally mounted on said bracket and resiliently movable relative to said bracket.

* * * * *